(12) United States Patent
Ahn

(10) Patent No.: US 8,138,009 B2
(45) Date of Patent: Mar. 20, 2012

(54) METHOD OF FABRICATING THIN FILM SOLAR CELL AND APPARATUS FOR FABRICATING THIN FILM SOLAR CELL

(75) Inventor: Donggi Ahn, Seoul (KR)

(73) Assignees: Samsung SDI Co., Ltd., Yongin-si (KR); Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/760,735

(22) Filed: Apr. 15, 2010

(65) Prior Publication Data

US 2011/0027938 A1 Feb. 3, 2011

(30) Foreign Application Priority Data

Jul. 30, 2009 (KR) ................. 10-2009-0070305

(51) Int. Cl.
*H01L 21/00* (2006.01)
(52) U.S. Cl. ............... 438/57; 438/66; 438/73; 438/93; 257/E21.001; 257/E21.07; 257/E21.071; 257/E21.072; 257/E21.073
(58) Field of Classification Search ........... 257/E21.001, 257/E21.07, E21.071, E21.072, E21.073
See application file for complete search history.

(56) References Cited

U.S. PATENT DOCUMENTS

| 4,327,119 | A  |   | 4/1982  | Lis et al. |
|-----------|----|---|---------|------------|
| 4,424,101 | A  | * | 1/1984  | Nowicki ................. 204/192.23 |
| 5,714,391 | A  |   | 2/1998  | Omura et al. |
| 5,770,763 | A  | * | 6/1998  | Martin et al. ................. 560/358 |
| 5,981,733 | A  | * | 11/1999 | Gamble et al. ............... 536/25.3 |
| 7,704,863 | B2 | * | 4/2010  | Ennaoui et al. ............... 438/497 |
| 2006/0062902 | A1 |   | 3/2006  | Sager et al. |
| 2007/0020400 | A1 |   | 1/2007  | Chang |
| 2008/0274577 | A1 |   | 11/2008 | Ennaoui et al. |
| 2009/0223556 | A1 | * | 9/2009  | Niesen et al. ................. 136/255 |

FOREIGN PATENT DOCUMENTS

| KR | 96-9240      | 3/1996 |
| KR | 100220371 B1 | 6/1999 |

* cited by examiner

*Primary Examiner* — Mohsen Ahmadi
(74) *Attorney, Agent, or Firm* — Christie, Parker & Hale, LLP

(57) ABSTRACT

Disclosed is a method of fabricating a thin film solar cell including introducing a reaction solution into a reaction chamber, fixing a supporter onto a loader, disposing the loader in the reaction chamber to immerse the supporter into the reaction solution, and heating the supporter and coating a buffer layer. In addition, an apparatus of fabricating a thin film solar cell including a reaction chamber mounted with an inlet of a reaction solution and an outlet of waste water, and a loader disposed in the reaction chamber and being capable of moving up and down, is disclosed.

12 Claims, 3 Drawing Sheets

METHOD OF FABRICATING THIN FILM SOLAR CELL AND APPARATUS FOR FABRICATING THIN FILM SOLAR CELL

This application claims priority to Korean Patent Application No. 10-2009-0070305 filed on Jul. 30, 2009, and all the benefits accruing therefrom under 37 C.F.R. 119, the contents of which are incorporated herein by reference in their entirety.

BACKGROUND OF THE INVENTION

1. Field of the Invention

This disclosure relates to a method of fabricating a thin film solar cell and an apparatus for fabricating a thin film solar cell.

2. Description of the Related Art

A solar cell converts solar energy into electrical energy. The solar cell, which includes a diode generally having PN junctions, can be classified into various compositional types of solar cell depending upon the composition of the material used to form the light absorbing layer.

A solar cell including a light absorbing layer of silicon may be subclassified as either a crystalline substrate (wafer) solar cell or a thin film (amorphous, polycrystalline) solar cell. In addition, a compound thin film solar cell based on a CIGS ($CuInGaSe_2$) or CdTe material, a Group III-V solar cell, a dye-sensitive solar cell, and an organic solar cell may each be exemplified as representative solar cells.

Of these, the thin film solar cell which includes a light absorbing layer of CIGS or CdTe further includes a buffer layer of CdS between the light absorbing layer and an adjacent electrode, to compensate for a band gap difference and a lattice constant difference. The buffer layer is prepared in accordance with a chemical bath deposition ("CBD") process. A CBD process may include dissolving, for example, a cadmium (Cd) source material and a sulfur (S) source material in an ammonia solution, immersing a substrate formed to have a light absorbing layer therein to coat the substrate, and heating the coated substrate to provide a buffer layer having a thickness of several tens of nm. However, the CBD process undesirably increases the process cost and causes environmental contamination due to its requirement of large quantities of hazardous chemicals.

BRIEF SUMMARY OF THE INVENTION

In an embodiment, a method of fabricating a thin film solar cell is provided in which the process cost is inexpensive, the cost of processing waste solution and waste water is saved, and the electrical and optical characteristics of the solar cell are improved.

In another embodiment, an apparatus for fabricating the buffer layer is disclosed.

In another embodiment, a method of fabricating a thin film solar cell is provided that includes introducing a reaction solution into a reaction chamber, fixing a supporter on a loader, disposing the loader in the reaction chamber so that the loader reversibly immerses the supporter in the reaction solution, heating the supporter to form a buffer layer.

In another embodiment, an apparatus for fabricating a thin film solar cell includes a reaction chamber mounted with an inlet for a reaction solution and an outlet for waste water, and a loader disposed in the reaction chamber and being capable of moving up and down.

The reaction solution may include a metal source material and a complexing agent. The reaction solution may further include an anion source material.

The metal source material may be a compound including one selected from the group consisting of cadmium (Cd), zinc (Zn), indium (In), and combinations thereof, and the anion source material may be a compound including one selected from the group consisting of S, Se, Te, O, OH, and combinations thereof. The complexing agent may be selected from the group consisting of ammonia, hydrazine, an alkanol amine, an alcohol, and combinations thereof.

The supporter may be a substrate or an electrode including a light absorbing layer. The entire supporter, or only the surface of the supporter may be immersed in the reaction solution.

The supporter may be heated to a temperature of the surface where the supporter contacts the reaction solution of about 20 to about 100° C.

The supporter may be heated by electric heating or lamp heating of the loader. The loader and the supporter may each have thermal conductivity of about 30% or more, respectively, and in a specific embodiment, the loader and the supporter may each have thermal conductivity of about 50% or more, respectively.

The reaction chamber may further include an agitator or an ultrasonic wave vibrator.

Other aspects of this disclosure will be described in the following detailed description.

DETAILED DESCRIPTION OF THE INVENTION

Figure 1:
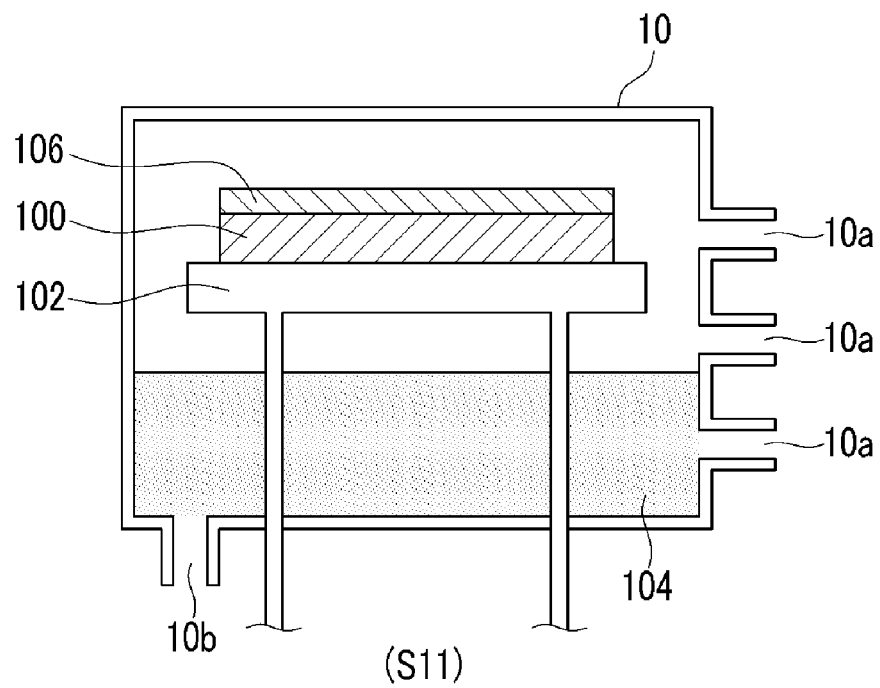
FIG. 1 is a view showing a process of fabricating a thin film solar cell according to an exemplary embodiment.
Figure 1:
Figure 1:
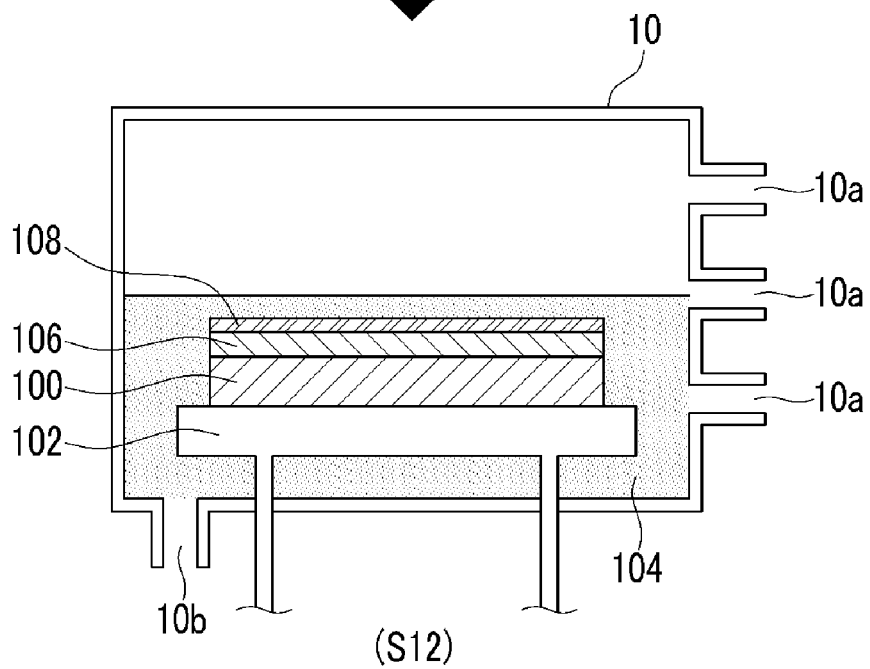

This disclosure will be described more fully hereinafter with reference to the accompanying drawings, in which exemplary embodiments are shown. As those skilled in the art will realize, the described embodiments may be modified in various different ways, all without departing from the spirit or scope of this disclosure.

In the drawings, the thickness of layers, films, panels, regions, and the like are exaggerated for clarity. Like reference numerals designate like elements throughout the specification. It will be understood that when an element such as a layer, a film, a region, or a substrate is referred to as being "on" or "disposed on" another element, it may be directly on the other element, or intervening elements may also be present.

As used herein, the terms "a" and "an" are open terms that may be used in conjunction with singular items or with plural items. It will be further understood that the terms "comprises" and/or "comprising," when used in this specification, specify the presence of stated features, regions, integers, steps, operations, elements, and/or components, but do not preclude the presence or addition of one or more other features, regions, integers, steps, operations, elements, components, and/or groups thereof. All ranges and endpoints reciting the same feature are independently combinable.

As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, a method of fabricating a thin film solar cell according to an exemplary embodiment is described with reference to FIGS. 1 to 4.

FIG. 1 is a view showing an exemplary process of fabricating a thin film solar cell. First, in step S11, a reaction solution 104 is introduced into a reaction chamber 10 through inlet ports 10a. A supporter 100 is reversibly fixed on a loader 102 disposed inside the reaction chamber 10. The reaction solution 104 may be introduced before or after disposing the loader 102 inside the reaction chamber 10. In an embodiment, the reaction solution 104 is introduced after the loader 102 is introduced to chamber 10.

The reaction solution 104 provides the components for forming a buffer layer 108 on the supporter 100. The reaction solution 104 may include a metal source material, an anion source material, and a complexing agent. In an embodiment, the reaction solution is aqueous based. In another embodiment, the reaction solution is a nonaqueous solution. The metal source material may be a compound including a metal selected from the group consisting of cadmium (Cd), zinc (Zn), indium (In), mercury (Hg), and combinations thereof. The metal source material may include any material as long as it is dissolved in a solvent, for example, it includes a halide, an alkoxide, a carboxylate, an ammonium salt, a carbonate, a nitrate, a sulfate, or the like. In an exemplary embodiment, the metal source material is cadmium chloride, cadmium bromide, cadmium nitrate, cadmium carbonate, cadmium acetate, cadmium sulfate, zinc chloride, zinc bromide, zinc nitrate, zinc carbonate, zinc acetate, zinc sulfate, indium chloride, indium bromide, indium nitrate, indium carbonate, indium acetate, indium sulfate, mercuric chloride, mercuric bromide, mercuric nitrate, mercuric carbonate, mercuric acetate, mercuric sulfate, any combination thereof, and the like.

The metal source material may be present in a concentration of about 0.001M to about 1M, specifically about 0.01M to about 1M in the reaction solution. The be proceed in a desirable manner even where the metal source material is included in a small amount.

The complexing agent included in reaction solution 104 forms a complex with the metal of the metal source material, and may be selected from the group consisting of ammonia, hydrazine, an alkanol amine, an alcohol, and combinations thereof, but is not limited thereto. The ammonia may be present at an ammonia solution, and the pH of the reaction solution may be adjusted by mixing it with aqueous ammonium hydroxide ($NH_4OH$) or by bubbling gaseous ammonia ($NH_3$). The alkanol amine may include a C1 to C6 alkanol such as ethanolamine, trimethylol amine, diethanolamine, triethanol amine, trimethylolpropylamine, tripropanolamine, a combination thereof, or the like. The alcohol may be represented by ROH, and the R may be a C1 to C6 alkyl such as, for example, methanol, ethanol, isopropanol, n-propanol, n-butanol, isobutanol, sec-butanol, t-butanol, n-pentanol, neopentanol, n-hexanol, cyclohexanol, a combination thereof, or the like. The complexing agent may be present in an amount of about 0.1M to about 10M. Although the complexing agent may be included in the reaction solution 104 in a small amount as in the above metal source material, it is possible for the reaction of the reaction solution 104 to form buffer layer 108 on the supporter 100 to proceed.

The reaction solution 104 may further include an anion source material. The anion source material includes one selected from the group consisting of S, Se, Te, O, OH, and combinations thereof. The anion source material may be an elemental material or may be an organic compound which includes an anion such as sulfur, selenium, oxygen (as an oxide or superoxide), a hydroxide, a combination thereof, or the like. Examples of such an organic compound includes thiourea ($SC(NH_2)_2$), selenourea ($SeC(NH_2)_2$), and the like. The anion source material may be used at about 0.001M to about 5M, and further is present in a stoichiometric amount based on the total molar amount of metal source material. In an embodiment, one equivalent of anion source material is present for every equivalent of divalent metal source material.

The reaction chamber 10 is provided with an inlet 10a of a reaction solution for injecting the reaction solution 104 into the reaction chamber 10, and is further provided with an outlet 10b for the discharge of waste water generated by the reaction. The position and number of inlets 10a of reaction solution and outlets 10b of waste water may vary.

The loader 102 is designed so that it can be loaded with a supporter 100 and enclosed in reaction chamber 10, then after the reaction, the reaction chamber can be opened so as to remove the supporter 100 coated with buffer layer 108. The loader 102 is specifically designed, in an embodiment, to be moved up and down (vertically) in the reaction chamber 10, and to ensure the supporter 100 loaded on the loader 102 does not make contact with the reaction solution 104 before the reaction is initiated. In this way, it is possible to prevent overuse of the reaction solution 104, and to prolong the useful life of the reaction solution 104 and thereby reduce the amount of waste.

The supporter 100 may be fixed on the loader 102 by application of vacuum through a vacuum adsorption hole (not shown) on the loader 102 and contacting the supporter 100 to the loader 102, but is not limited thereto. Use of vacuum to affix the supporter 100 to the loader provides an efficient, reversible method of securing the supporter 100 to the loader 102.

The supporter 100 may be, for example, a substrate for a solar cell, or an electrode including a light absorbing layer 106. In an embodiment, a light absorbing layer 106 is disposed on a surface of the supporter 100, opposite the side of the supporter 100 fixed to the loader 102.

The substrate may a hard material or a flexible material. Non-limiting examples of hard material that may be used for the substrate 102 include a glass plate, a quartz plate, a silicon plate, a synthetic resin plate, a ceramic plate, a metal plate, and the like. A metal plate, where used, may include a stainless steel foil, an aluminum foil, and the like. Examples of a flexible material include synthetic resins such as polyethylene naphthalate (PEN), polyethylene terephthalate (PET), polycarbonate, polyvinyl alcohol, polyacrylate, polyimide, polynorbornene, polyethersulfone (PES), and the like.

When the supporter 100 is a substrate, as for a solar cell, a back electrode is disposed between the substrate and the light absorbing layer 106. The back electrode may be formed of a conducting material including molybdenum (Mo), aluminum (Al), silver (Ag), gold (Au), platinum (Pt), nickel (Ni), copper (Cu), or the like.

When the supporter 100 is an electrode, the electrode is a front electrode and is formed of a transparent conductive oxide ("TCO") such as ZnO:Al, ZnO:B, $SnO_2$, indium zinc oxide ("IZO"), or indium tin oxide ("ITO"). Inclusion of a transparent electrode generally minimizes light transmission deterioration and has both low resistivity and excellent (minimal) surface roughness. A buffer layer 108 may be formed on the electrode.

The light absorbing layer 106 may include a semiconductor material such as Group II-IV compounds, Group II-III compounds, Group IV-VI compounds, or combinations thereof. The Group II-VI compound may be a binary compound selected from the group consisting of CdS, ZnS, CdSe, ZnSe, ZnO, and the like; the group II-III compound may be a binary compound selected from the group consisting of $In_2S_3$, $In_3Se_3$, and the like; the group IV-VI compound may be selected from the group consisting of $SnO_2$, $SnS_2$, $SnSe_2$, and the like; and the combinations thereof may include a compound selected from the group consisting of Zn—S—OH, Zn—S—O—OH, Zn—Mg—O, Cd—Zn—S, In—Ga—S, In—O—OH, In—S—O, In—S—O—OH, a combination thereof, and the like.

As shown in FIG. 1, step S12, the loader 102 is disposed in the reaction chamber 10 to immerse the supporter 100 with light absorbing layer 106 into the reaction solution 104, and is then heated to provide a buffer layer 108 on the light absorbing layer 106. In an embodiment, the buffer layer 108 is formed on a surface of the supporter 100. In another embodiment, the buffer layer is formed on a surface of the light absorbing layer 106 opposite supporter 100. In some embodiments, other layers such as an electrode layer may intervene between the buffer layer 108 and supporter 100.

In the reaction, reaction solution 104 which includes a metal source material of a Cd-containing salt, an anion source material of sulfur (S)-containing salt, and a complexing agent of ammonia, generates CdS according to the proposed stepwise Reaction Scheme 1, which takes place in the reaction solution 104, and in Reaction Scheme 2 which takes place on the surface of light absorbing layer 106 of the supporter $Cd^{2+}+4NH_3\rightarrow Cd(NH_3)_4^{2+}$ $SC(NH_2)_2+OH^-\rightarrow SH^-+H_2O+CN_2H_2$ $SH^-+OH^-\rightarrow S^{2-}+H_2O$ $Cd^{2+}+S^{2-}\rightarrow CdS$ [Reaction Scheme 1]

$Cd^{2+}+4NH_3\rightarrow Cd(NH_3)_4^{2+}$ $Cd[NH_3]_4^{2+}+2OH^-\rightarrow [Cd(OH)_2]ads+4NH_3$ $[Cd(OH)_2]ads+SC(NH_2)_2\rightarrow Cd(SC(NH_2)_2(OH)_2]ads$ $Cd(SC(NH_2)_2(OH)_2]ads\rightarrow CdS+CN_2H_2+2H_2O$ [Reaction Scheme 2]

In Reaction Scheme 2, "ads" stands for the adsorption on a light absorbing layer 106.

Reaction Scheme 1 is a homogenous (solution phase) reaction, whereas Reaction Scheme 2 is a heterogeneous reaction. In Reaction Scheme 1, CdS particles form in the reaction solution 104 to provide a coarse layer in which light transmission decreases, but during Reaction Scheme 2, the CdS forms (is reacted) on the surface of the light adsorptive layer 106 to provide a transparent dense layer. Accordingly, it is desirable to suppress Reaction Scheme 1 and to accelerate Reaction Scheme 2 while forming a buffer layer 108. Surprisingly, the method of heating may be used to control the predominance of Reaction Scheme 2 over Reaction Scheme 1 and to provide a desirable buffer layer 108 with low surface roughness.

When the reaction solution 104 is heated, it is difficult to suppress the homogeneous reaction in which the particles are generated in the reaction solution 104. Accordingly, the supporter 100 is instead heated by partially heating the loader 103 rather than heating the reaction solution 104, so that the heterogeneous reaction of Reaction Scheme 2 is performed on the surface of the light absorbing layer 106 in the presence of heat localized to the desired reactive surface of the light adsorbing layer 106. In this way, a dense buffer layer 108 having high light transmission is provided, and further, the buffer layer may be formed with high specificity and selectivity on the light adsorbing layer 106.

When the loader 102 is partially heated while immersed in the reaction solution 104, the temperature of the bulk of the reaction solution 104 remains low while heat is localized to the loader and the supporter 100 fixed to the loader, so that the homogeneous reaction is suppressed in the bulk of reaction solution 104 and the amount of reactants consumed in the reaction solution 104 decreases. By heating in this way, it is possible to provide a buffer layer 108 having improved film density and thickness, and surface uniformity, with reduced defectivity and hence improved electrical and optical characteristics by accelerating the heterogeneous reaction on the surface of the light absorbing layer 106, when compared with a comparable buffer layer formed on a light absorbing layer in which a bulk of the reaction solution is heated to form the buffer layer. For example, when the buffer layer 108 is dense as provided by the instant method of deposition of the buffer layer by heating the loader immersed in the reaction solution, the open circuit voltage (Voc) is increased, and when the light transmission is high, short-circuit current ($J_{sc}$) is improved. The thus improved open circuit voltage and Jsc may improve the efficiency of solar cell.

Figure 2:
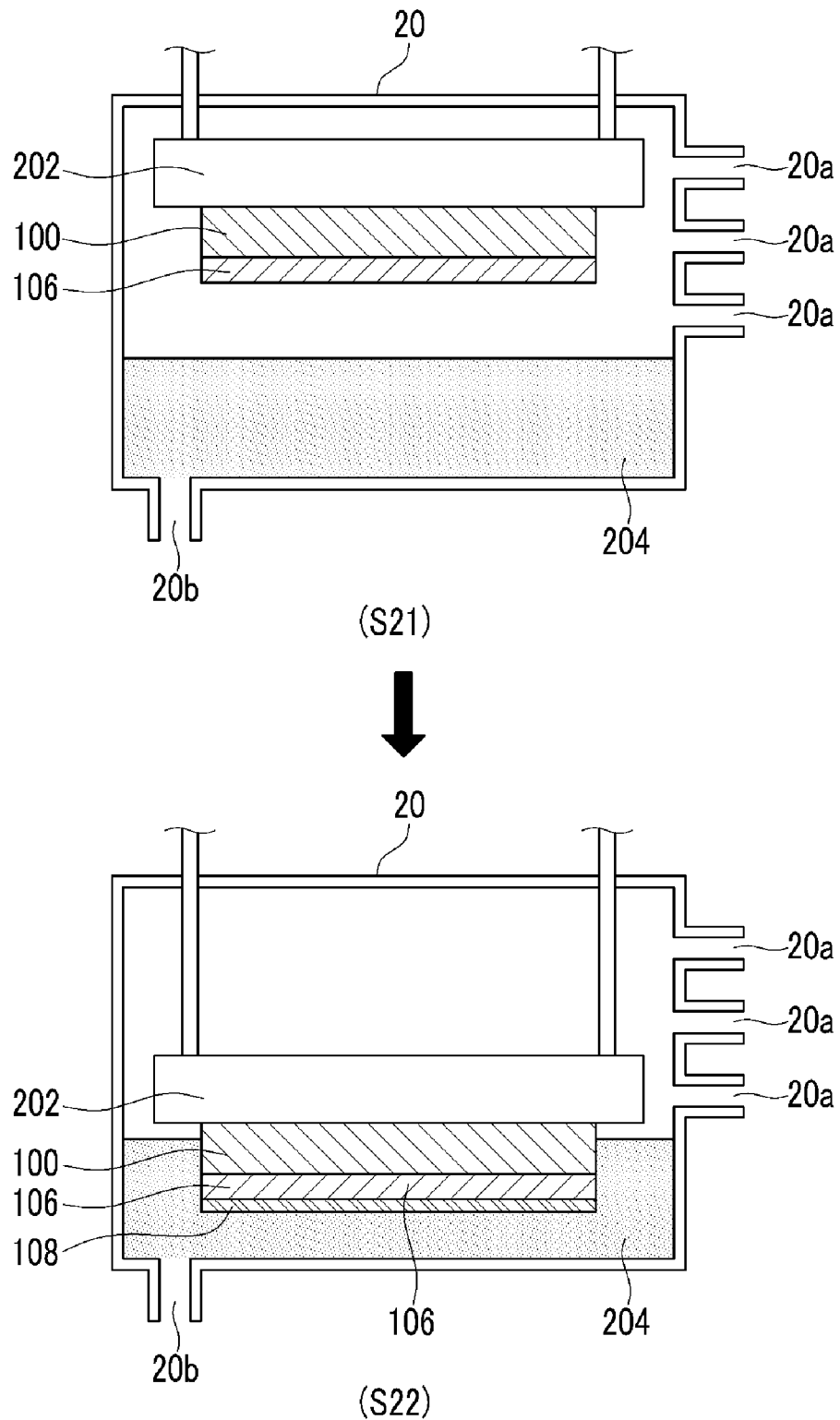
FIG. 2 is a view showing a process of fabricating a thin film solar cell according to another exemplary embodiment.

In another embodiment, shown in FIG. 2, a loader 202 may be provided at the upper part of the reaction chamber 20, such that the loader 202 is not immersed in the reaction solution 204, but that only the supporter 100 and light absorbing layer 106 are immersed in the reaction solution 204. In step S21 of FIG. 2, after introducing a reaction solution 204 into the reaction chamber 20, the supporter 100 is fixed on the loader 202 and disposed in the reaction chamber 20.

The reaction solution 204 may include a metal source material and a complexing agent, and may selectively include an anion source material. The metal source material, the complexing agent, and the anion source material are the same as described for the reaction solution 104.

Also in FIG. 2, step S22, after immersing the surface of the light absorbing layer 106 in the reaction solution 204, the loader 202, and hence the supporter 100 and light absorbing layer 106, are is heated to provide a buffer layer 108. The reaction chamber 20 is mounted with an inlet 20a of a reaction solution for introducing the reaction solution 204 into a reaction chamber 20, and an outlet 20b of waste water for discharging the generated waste water after the reaction. The position and number of inlets 20a of reaction solution and outlets 20b of waste water may vary.

As shown in FIG. 2, when only the surface of the light absorbing layer 106 to be formed with the buffer layer 108 is contacted with the reaction solution 204, fewer adventitiously generated particles from the reaction of the reaction solution 204 may adhere to the surface of the light adsorbing layer 106 by gravity even though the particles are generated in the reaction solution 204. Accordingly, the buffer layer 108 so formed by the heterogeneous reaction further exhibits improved electrical and optical characteristics when compared to a comparable buffer layer prepared by heating a bulk of a comparable reaction solution. Since only the surface of the light absorbing layer 106 of the supporter 100 is immersed in the reaction solution 204, the amount of reaction solution 204 used may be conserved, and the bath life of the reaction solution 204 may be increased.

In addition, the reaction chambers 10 and 20 may further include an agitator for uniformly maintaining the reaction solutions 104 and 204, respectively.

The loaders 102 and 202 may further include an ultrasonic wave vibrator for preventing the particles obtained from the homogeneous reaction from adhering to the surface of the light adsorbing layer 106 as shown in FIGS. 1 and 2.

Figure 3:
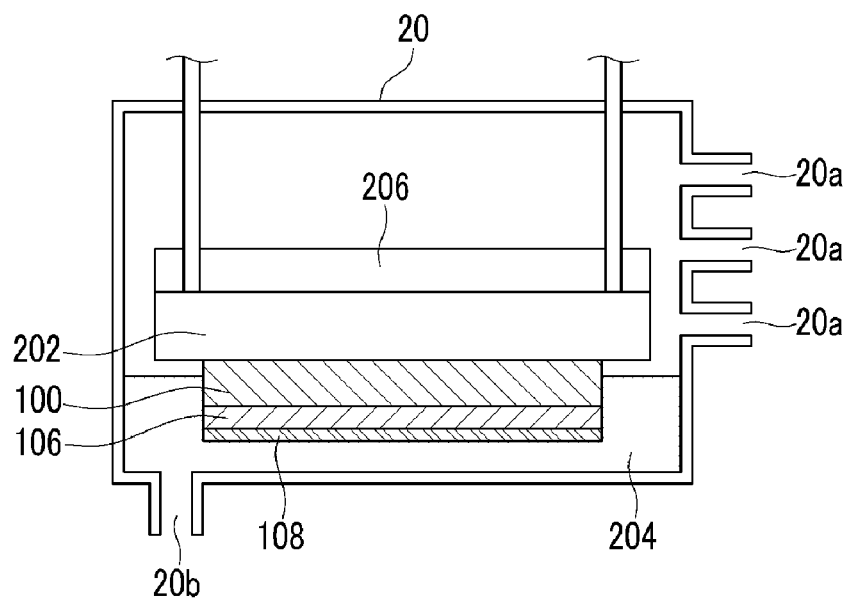
FIG. 3 is a schematic view showing the fabrication device for a thin film solar cell including an electric heating device according to an exemplary embodiment.
Figure 4:
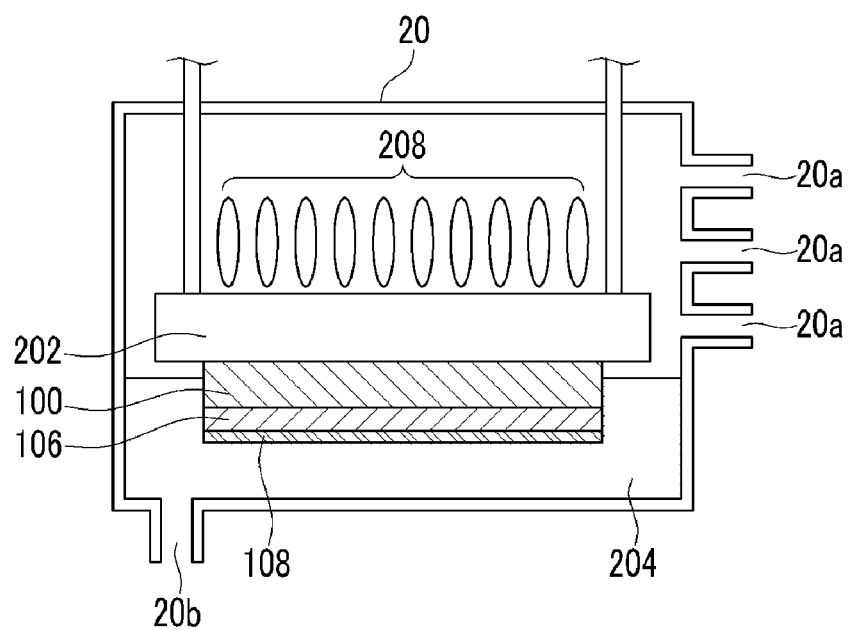
FIG. 4 is a schematic view showing the fabrication device for a thin film solar cell including an optical heating device according to an exemplary embodiment.

Heating the supporter 100 may be carried out by mounting an electric heating device or an optical heating device in the loaders 102 and 202. FIGS. 3 and 4 schematically show a reaction chamber including an electric heating device and an optical heating device, respectively.

As shown in FIG. 3, the substrate 100 may be heated by providing an electric heater 206 to the loader 202. The heater 206 may be provided on the opposite surface to that of the supporter adhering surface of the loader 202. Each of the loader 202 and the supporter 100 may have thermal conductivity of about 30% or more, or in another embodiment, each may have thermal conductivity of about 50% or more, and may further have a thermal conductivity of about 95% or less. Thermal conductivity refers to the heat used for heating the substrate when the heating energy is 100.

As shown in FIG. 4, the supporter 100 can be heated, in an embodiment, by providing a lamp 208 on the loader 202. The lamp 208 may include a halogen lamp, an ultraviolet (UV) lamp, a mercury lamp, or the like. Where a lamp is used for heating, either or both of the loader 202 and the supporter 100 may have thermal conductivity of about 50% or more, and in another embodiment, may have thermal conductivity of from about 70% to about 98%. The lamp is selected to emit light in a wave length region suitable for the thermal conductivity of loader 202 and supporter 100, so the supporter 100 and the light absorbing layer 106 disposed thereon may be promptly heated.

The light absorbing layer 106, on which the buffer layer 108 is to be formed, may thus be heated to a surface temperature of about 20 to about 100° C., specifically about 30 to about 90° C., and more specifically about 40 to about 90° C. The layer electrical and optical characteristics may be improved and the coating speed is effectively controlled by heating these layers within the range.

The buffer layer 108 may include CdS, ZnS, ZnO, ZnSe, $In_2S_3$, $ZnS_xO_{1-x}$ (0<x<1), $ZnS_xO_yOH_{1-x-y}$ (0<x+y<1), $In_2(S_xO_{1-x})_3$ (0<x<1), $In_2(S_xO_yOH_{1-x-y})_3$, (0<x+y<1), or the like, but is not limited thereto.

The processes shown in FIGS. 1 and 2 may improve the mass-productivity of a thin film solar cell by applying these processes to a batch or continuous process, while improving the film density and other physical properties to provide in turn improved electrical and optical characteristics.

In another embodiment, a buffer layer for a thin film solar cell including the reaction product of: a metal source material, complexing agent, and optionally an anion source material, wherein the buffer layer is formed on a surface of a light absorbing layer disposed on a surface of a supporter, wherein the buffer layer is formed by immersion of the supporter including the light absorbing layer into a reaction solution by a loader, and heating the loader, supporter, and light absorbing layer, and wherein the buffer layer so formed has improved film density and thickness compared with a comparable buffer layer formed on a light absorbing layer in which a bulk of the reaction solution is heated to form the buffer layer.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of fabricating a thin film solar cell comprising:
   introducing a reaction solution into a reaction chamber, wherein the reaction solution comprises a metal source material;
   fixing a supporter to a loader by vacuum, wherein the supporter is a substrate or an electrode;
   disposing a light absorbing layer on a surface of the supporter;
   disposing the loader in the reaction chamber to immerse the supporter with the light absorbing layer into the reaction solution; and then
   heating the supporter to form a buffer layer on the light absorbing layer, wherein heating is carried out by electric heating or lamp heating the loader.

2. The method of claim 1, wherein the reaction solution further comprises a complexing agent.

3. The method of claim 2, wherein the complexing agent comprises one selected from the group consisting of ammonia, hydrazine, an alkanol amine, an alcohol, and combinations thereof.

4. The method of claim 1, wherein the metal source material comprises a metal selected from the group consisting of cadmium (Cd), zinc (Zn), indium (In), and combinations thereof.

5. The method of claim 1, wherein the reaction solution further comprises an anion source material.

6. The method of claim 5, wherein the anion source material comprises one selected from the group consisting of S, Se, Te, O, OH, and combinations thereof.

7. The method of claim 1, wherein the entire supporter or only the surface of the supporter is immersed in the reaction solution.

8. The method of claim 1, wherein the supporter is heated to a temperature for the surface of the supporter which contacts the reaction solution, of about 20° C. to about 100° C.

9. The method of claim 1, wherein each of the loader and the supporter has thermal conductivity of about 30% or more.

10. The method of claim 1, wherein each of the loader and the supporter has thermal conductivity of about 50% or more.

11. The method of claim 1, wherein the reaction chamber further comprises an agitator.

12. The method of claim 1, wherein the reaction chamber further comprises an ultrasonic wave vibrator.

* * * * *